US008023239B2

(12) United States Patent
Beyer

(10) Patent No.: US 8,023,239 B2
(45) Date of Patent: Sep. 20, 2011

(54) CONTROL MODULE FOR AN ELECTRIC CIRCUIT BREAKER, METHOD FOR OPERATION THEREOF, AND ELECTRIC PROTECTION SYSTEM

(75) Inventor: Stefan Beyer, Ebermannsdorf (DE)

(73) Assignee: Siemens Aktiengesellschaft, Munich (DE)

( * ) Notice: Subject to any disclaimer, the term of this patent is extended or adjusted under 35 U.S.C. 154(b) by 572 days.

(21) Appl. No.: 12/072,384

(22) Filed: Feb. 26, 2008

(65) Prior Publication Data

US 2008/0218926 A1 Sep. 11, 2008

(30) Foreign Application Priority Data

Mar. 7, 2007 (EP) ..................................... 07004707

(51) Int. Cl.
*H01H 73/00* (2006.01)
*G01R 31/327* (2006.01)

(52) U.S. Cl. ........................................ 361/115; 324/421

(58) Field of Classification Search .................. 361/115; 324/421

See application file for complete search history.

(56) References Cited

U.S. PATENT DOCUMENTS

| | | | | |
|---|---|---|---|---|
| 5,243,291 | A * | 9/1993 | Umemura | 324/418 |
| 5,455,733 | A * | 10/1995 | Waggamon | 361/115 |
| 5,585,607 | A | 12/1996 | Kato et al. | |
| 5,939,961 | A | 8/1999 | Fevre | |
| 6,023,399 | A * | 2/2000 | Kogure | 361/23 |
| 2002/0175568 | A1* | 11/2002 | Clement et al. | 307/326 |
| 2003/0011250 | A1* | 1/2003 | Pullmann et al. | 307/326 |
| 2003/0058623 | A1* | 3/2003 | Veil et al. | 361/728 |
| 2006/0209488 | A1* | 9/2006 | Papenbreer | 361/160 |

FOREIGN PATENT DOCUMENTS

| | | | |
|---|---|---|---|
| CN | 1643758 | A | 7/2005 |
| DE | 19622447 | A1 | 12/1996 |
| EP | 1058283 | A2 | 12/2000 |
| JP | 01016969 | A * | 1/1989 |

* cited by examiner

*Primary Examiner* — Jared Fureman
*Assistant Examiner* — Scott Bauer

(57) ABSTRACT

A control module with interrupt function for an electric circuit breaker has a voltage input for a control voltage, an output carrying the control voltage to which output an interrupter for the circuit breaker can be connected, an input for the control voltage fed back from the interrupter, a terminal for the circuit breaker, said terminal being connected to the input, and a measuring unit for measuring current and/or voltage at the input and at the output. An electric protection system has an electric circuit breaker, an interrupter and a control module. In a method for operating a control module, the circuit breaker is supplied during its operation with voltage and current via the terminal, the measuring unit determines currents and/or voltages at the input and the output, the control module transmits currents and/or voltages to an evaluating unit for determining a characteristic value which correlates to the quality of the interrupter, the evaluating unit determines, from currents and/or voltages, a characteristic value which correlates to the quality of the interrupter.

14 Claims, 1 Drawing Sheet

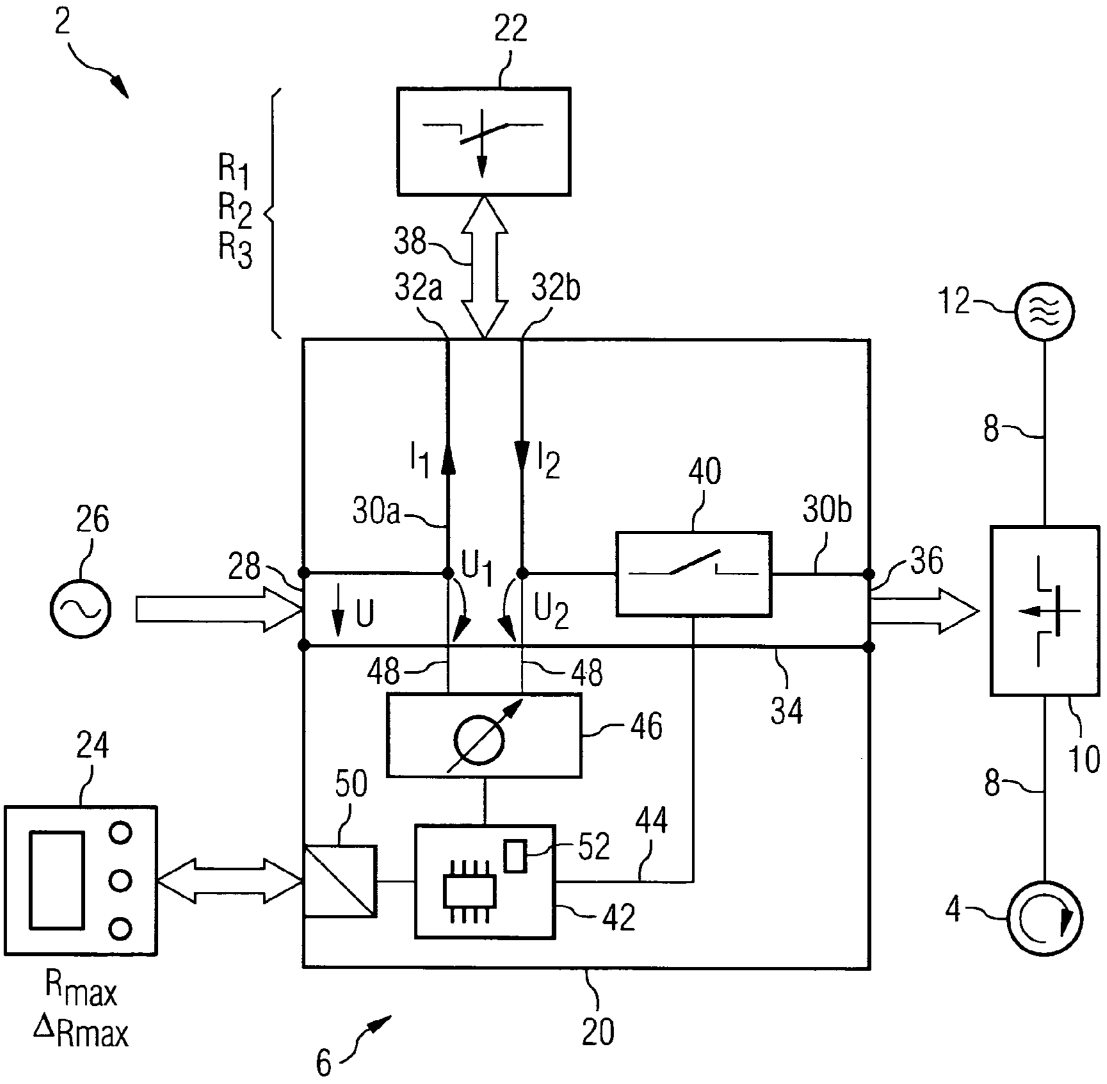
2
22
R1
R2
R3
38
32a
32b
12
8
I1
I2
40
30a
30b
26
28
U1
U2
36
U
48
48
34
46
10
8
24
50
44
52
42
4
Rmax
ΔRmax
20
6

CONTROL MODULE FOR AN ELECTRIC CIRCUIT BREAKER, METHOD FOR OPERATION THEREOF, AND ELECTRIC PROTECTION SYSTEM

CROSS REFERENCE TO RELATED APPLICATIONS

This application claims priority of European Patent Office application No. 07004707.1 EP filed Mar. 7, 2007, which is incorporated by reference herein in its entirety.

FIELD OF INVENTION

The invention relates to a control module with interrupt function for an electric circuit breaker, a method for operating a control module of this type and an electric protection system.

BACKGROUND OF INVENTION

Electrical consumers with high power ratings, for example, electric motors in electric drive systems for industrial production technology are not usually connected with their terminals directly to a power network, but are connected thereto via an electric circuit breaker. Therefore, for example, the aforementioned electric motors are connected to a 380V three-phase power network as circuit breakers known as "contactors". Thus, for rapid and reliable complete separation of the consumption from the power network, the circuit breaker is opened.

The circuit breaker is usually operated with a control voltage of 24V, that is, it is closed, to connect the electrical consumer to the network, by applying the control voltage of 24V. For various reasons, for example, safety considerations, a circuit breaker of this type has an interrupter, for example, in the form of an emergency-stop switch or a limit switch. In the event of an emergency or a fault with the load, the interrupter is activated, interrupting the control voltage to the circuit breaker, so that the circuit breaker opens and thus reliably disconnects the electrical consumer from the power network. The circuit breaker and the interrupter together comprise an electrical protection system for the electrical consumer.

A number of solutions are currently available for protection systems. It is known, for example, to connect circuit breaking electronics having digital inputs to which the interrupter is connected, on the line side of the circuit breaker. Herein, the interrupter does not actually interrupt the control voltage of the circuit breaker, but merely triggers a signal for the circuit breaking electronics, which then performs this task. A design of this type has the disadvantage, for example, that in the event of an error in the circuit breaking electronics, even with the interrupter triggered, the circuit breaker does not open.

In other variants of protection systems, therefore, the interrupter is connected as the first element to the supply lead for the control voltage. By triggering the interrupter, the circuit breaker is reliably disconnected from the control voltage and it opens. By this means, however, all the other components, for example a plant control system, that are also supplied by the control voltage, are likewise rendered power-free. Therefore, following renewed closing of the interrupter, the whole system including the plant control system must be restarted, which can result in equipment having a very long recovery time. The power-free plant control system is therefore unable to perform any other functions during the equipment idle time, but is switched off entirely.

An arrangement of this type involves a high level of wiring effort, since a relatively large plant may, for example, have a plurality of interrupters distributed throughout it and the control voltage must be fed right through the plant via all the interrupters in series until it reaches the plant control system itself or the individual circuit breaker.

SUMMARY OF INVENTION

Apart from the necessity for faultless functioning of the interrupter with respect to its switch-off behaviour, it is desirable that the interrupter actually only triggers the circuit breaker when this is desirable. A fault, that is, unintentional triggering of the control voltage, leads to unwanted plant stoppage, etc.

It is an object of the present invention to provide an arrangement and a method for a circuit breaker with interrupter, which permits reliable interruption of the circuit breaker wherein, with the interrupter triggered, other system components optionally continue to be supplied with voltage.

With regard to the device, the object is achieved with a control module for an electric circuit breaker, wherein the control module has an interrupt function. The control module comprises a voltage input via which the control module can be supplied with a control voltage of, for example, 24V. This is therefore continuously applied to the control module. In the control module, the control voltage is fed, without interruption, to an output to which an interrupter can be connected, for example, via a supply lead. The control module has an input to which the interrupter is also connected. When in operation, the interrupter therefore feeds the control voltage back to the input, but if the interrupter is triggered, then the control voltage is no longer applied to the input.

In the control module, the input, and thus the control voltage which, depending on the switching state of the interrupter, is either present or not present, is fed to a terminal to which the circuit breaker can also be connected. The circuit breaker is therefore only supplied with control voltage provided that the interrupter is not triggered.

Also integrated into the control module is a measuring unit which serves to measure current and/or voltage at the input and the output. The measuring unit therefore measures one electrical variable at the interrupter and its supply lead (which is always also meant when the interrupter is mentioned below). The control module conducts the measured values of current and/or voltage to an evaluating unit for further processing.

Rapid and reliable switching off of the circuit breaker is also ensured since the interrupter interrupts the control voltage to the circuit breaker, or the control voltage is fed across the interrupter. The relevant safety regulations (e.g. DIN standards) are therefore met. However, the control module remains connected to the control voltage, even with the interrupter triggered. Any plant control system that may be integrated into the control module also remains in operation. The recovery time of a system is thus reduced, since the remaining plant control system is no longer switched off.

By the measurement of current and/or voltage flowing through or applied across the interrupter, a characteristic quantity correlated to the quality of the interrupter, for example, its volume resistance, can be determined. Newer circuit breakers are operated, for example, with a pulsed control voltage. Herein, for example, rise times, edge steepness and the like can be determined at the input and output as current-voltage characteristics for the interrupter. Once a voltage has been measured, it is also possible, for example, to find the corresponding current in a look-up table, given that the characteristic of the circuit breaker is known.

The characteristic quality, for example, the current characteristic of the interrupter determined in a known condition (when new) can be monitored throughout its service life. If the relevant current characteristic, and thereby the characteristic quantity, changes, for example, if its ohmic resistance suddenly increases, this indicates the impending failure of the interrupter. However, with the control module according to the invention, this is detected early, that is before the actual failure of the interrupter, and therefore the unintended interruption of the control voltage, and thus the plant stoppage. An interrupter that is thus threatened with failure can be replaced before its actual failure, for example, during regular servicing or a period of plant shut-down, without other disadvantage. The control module also detects the status of the circuit breaker (on or off) from the control switch and, using the aforementioned current characteristic, that is, the characteristic value, can also calculate the resistance of the interrupter.

Changes in the measured current and voltage, or in a characteristic quantity determined therefrom, also enable conclusions to be drawn early, for example, about conductor heating or contact wear. Terminal leads that are too long or incorrectly dimensioned for the interrupter can also be recognised in this manner. Lead heating as a result of incorrect wiring or dimensioning can be detected early and lead to the control module switching off of the load before an eventual failure. Due to the feeding of the control voltage inside the control module, even in the triggered state of the interrupter, the relevant measurements of current and/or voltage can be monitored and it can thereby be ensured that the protection system is kept ready for operation.

An evaluating unit, which evaluates the current or voltage determined by the measuring unit or at least passes them on for further processing, can also be provided in the control module.

A control switch for the circuit breaker can also be integrated in the control module between the input and the terminal. Even with the interrupter not triggered, the control switch can interrupt the passage of the control voltage from the input to the terminal and thus to the circuit breaker and thereby open the circuit breaker. The control switch thus serves—in contrast to the interrupter—for normal switching of the circuit breaker.

As mentioned above, the interrupter can, in particular, be an emergency stop switch or a limit switch. Suitable function monitoring is particularly important for interrupters of this type.

The control module can also have a bus interface to a plant control system. Normally, the plant control system undertakes control of the control switch, but also, for example, evaluation of the currents and/or voltages measured by the measuring unit and the relevant functional control of the interrupter. In other words, the evaluating unit can be integrated into the plant control system. Due to the continuous connection of the control module to the control voltage, communication with the plant control system is ensured via the bus interface, even when the interrupter is triggered.

The circuit breaker can be the circuit breaker of a motor starter system. Apart from gentle running up and down of the motor, the motor starter also undertakes the interrupter function or the emergency stop function. With motors, in particular, reliable stoppage when the interrupter is triggered is particularly important, as is the possibility, according to the invention, of minimising the recovery time and of avoiding erroneous switching off due to a failing interrupter.

The control module can be part of a complete electrical protection system wherein the electric circuit breaker and an interrupter are connected to the control module.

With regard to the method, the object of the invention is achieved with a method for operating a control module as described above, wherein the circuit breaker is supplied during its operation, via the terminal, with voltage and current, wherein the measuring unit determines currents and/or voltages at the input and/or output and an evaluating unit determines, from currents and/or voltages, a characteristic value which correlates to the quality of the interrupter.

In its basic embodiment, the method is based on determining the current flowing to the interrupter or back therefrom to the control module and/or the voltage across the interrupter, and therefrom to determine a characteristic value for the quality of the interrupter. This can, for example, then be compared with a reference value or a characteristic value determined in the new condition. The latter leads to checking of the interrupter for aging, wear or the like. The former can be used, for example, for checking the correct dimensioning of the interrupter and the terminal leads and their correct wiring.

Other aspects of the method according to the invention and advantageous embodiments have already been described in detail in relation to the control module according to the invention and the electric protection system together with their corresponding advantages.

BRIEF DESCRIPTION OF THE DRAWING

The invention will now be described further by reference to the exemplary embodiments shown in the FIGURE, in which, in a schematic sketch:

FIG. 1 shows an electric drive system with a protection system according to the invention in a block circuit diagram.

DETAILED DESCRIPTION OF INVENTION

FIG. 1 shows an electric drive system 2 comprising an electric motor 4 and a control system 6 controlling said motor. The motor 4 is connected via a terminal lead 8 into which a motor starter 10 is connected, to a three-phase power network 12. The motor starter 10, as a circuit breaker, comprises contactors, which will not be described here in greater detail, which can interrupt or connect the terminal lead 8.

The control system 6 comprises, as the control module, an interface module 20, an emergency stop push-button switch 22 as the interrupter, a plant control system 24 and a voltage supply 26.

The interface module 20 has a control voltage input 28 to which the voltage supply 26 (control voltage U, in this example 24V) is connected. The phase of the control voltage U at the control voltage input 28 is fed via a first phase lead 30*a* to an output 32*a*. A neutral lead 34 for the control voltage U which is also connected to the control voltage input 28 leads to a terminal 36. The phase of the control voltage U is fed from the output 32*a*, via a terminal lead 38, to the emergency stop switch 22 and from there back to an input 32*b*. Depending on the switching condition of the emergency stop switch 22, at the input 32*b*, either the control voltage U (push-button switch 22 closed) is applied, or no voltage (push-button switch 22 open). A further phase lead 30*b* runs from the input 32*b* via a mechanically or electronically controlled switch 40 to the terminal 36. The phase lead 30*b* and the neutral lead 34 are fed from the terminal 36 to the motor starter 10.

If therefore the control voltage U exists at the terminal 36, the motor starter 10 closes and the motor 4 starts up. If the emergency stop button 22 is pressed or the switch 40 opens, the voltage no longer exists at the terminal 36, the motor starter 10 opens and the motor 4 stops.

The interface module 20 also comprises a microprocessor 42, which actuates the switch 40 via a control lead 44. Also provided in the interface module 20 is a measuring device 46 which is connected via measuring leads 48 to the output 32*a* and the input 32*b*. The measuring device 46 is also connected to the microprocessor 42 and said microprocessor in turn is connected to a communications interface 50, via which it communicates with the plant control system 24.

The measuring device 46 determines the voltages U1 and U2 of the output 32*a* and the input 32*b* against the neutral lead 34 and/or the current I1 or I2 flowing to the emergency stop switch 22 or coming from it. The corresponding measurement variables U1,2 or I1,2 are passed by the measuring device 46 to the microprocessor 42, which determines therefrom one characteristic quantity 52 for the terminal lead 38 and the emergency stop switch 22, in this example, their ohmic resistance.

Alternatively, the relevant measured values are passed to the plant control system 24 and the characteristic quantity 52 determined there.

On installation of the drive system 2, the terminal lead 38 is unintentionally made too long. On the first system test, therefore, from the voltages U1, U2 and the currents I1, I2, a resistance R1 is determined which is greater than a maximum value Rmax stored in the plant control system. The plant control system 24 notifies this error to a plant operator (not shown) and the terminal lead 38 is replaced by a correct length. When the drive system 2 is started up, a repeat measurement supplies the resistance R2 as the characteristic quantity.

After several years of operation, during which time the resistance R2 between the input 32*a* and the output 32*b* is repeatedly measured, the resistance rises within a few days to a value R3. The deviation ΔR of R3 from R2, which is determined by the microprocessor 42, is greater than a permitted resistance deviation ΔRmax stored in the plant control system 24. The resistance change indicates an impending failure of the emergency stop switch 22, since its contact resistance is probably increasing rapidly. Within a few days, this would lead to erroneous, unintended triggering or interruption of the emergency stop switch 22 and thus to halting of the motor 4. Therefore, during a night-time production break when the motor 4 is stopped anyway, the emergency stop switch 22 is replaced with an identical new switch.

Alternatively, the emergency stop switch 22 can also be a limit switch. If, due to the failure of an operation sensor (not shown), the motor 4 travels to an end position, the limit switch is triggered. The control voltage U falls at the input 32*b* to 0V. The motor 4 is switched off, but the remainder of the drive system 2 remains in operation. In particular, the microprocessor 42 notifies the plant control system that the limit switch has been triggered but that the plant is otherwise operational, and thus that the plant shut-down has been performed by a correctly triggered limit switch.

The invention claimed is:

1. A control module with interrupt function for an electric circuit breaker, comprising:

a voltage input for a control voltage, which if absent from a terminal for the circuit breaker is effective for triggering the interrupt function for the electric circuit breaker;

an output carrying the control voltage to connect an interrupter switch for the circuit breaker;

a control voltage input for the control voltage fed back from the interrupter switch when the interrupter switch is in an electrically-closed switching condition;

a measuring unit coupled to the control voltage input and to the output, wherein the measuring unit measures a current and/or a voltage, the current and/or voltage measured by the measuring unit formed in response to the control voltage;

an evaluating unit coupled to the measuring unit to evaluate the current and/or voltage measured by the measuring unit to determine at least one electrical characteristic of the interrupter switch indicative of an impending failure of the interrupter switch; and a control switch responsive to an actuating signal from a processor, wherein, when the control switch is an electrically closed switching condition, the terminal for the circuit breaker is connected to apply the control voltage to the circuit breaker, and further wherein, when the control switch is an electrically open switching condition, the terminal for the circuit breaker is no longer connected to apply the control voltage to the circuit breaker.

2. The control module according to claim 1, wherein the interrupter switch is an emergency stop switch or a limit switch.

3. The control module according to claim 1, further comprising a bus interface to a plant control system.

4. The control module according to claim 1, wherein the circuit breaker is that of a motor starter system.

5. An electrical protection system, comprising:

an electric circuit breaker;

an interrupter switch; and a control module having an interrupt function for the electric circuit breaker, wherein the control module has:

a voltage input for a control voltage, which if absent from a terminal for the circuit breaker is effective to trigger the interrupt function for the electric circuit breaker;

an output carrying the control voltage to connect the interrupter switch for the circuit breaker;

a control voltage input for the control voltage fed back from the interrupter switch when the interrupter switch is in an electrically-closed switching condition;

a measuring unit coupled to the control voltage input and the output, wherein the measuring unit measures a current and/or a voltage, the current and/or voltage measured by the measuring unit formed in response to the control voltage;

an evaluating unit coupled to the measuring unit to evaluate the current and/or voltage measured by the measuring unit to determine at least one electrical characteristic of the interrupter switch indicative of an impending failure of the interrupter switch;

a control switch responsive to an actuating signal from a processor, wherein, when the control switch is an electrically closed switching condition, the terminal for the circuit breaker is connected to apply the control voltage to the circuit breaker, and further wherein, when the control switch is an electrically open switching condition, the terminal for the circuit breaker is no longer connected to apply the control voltage to the circuit breaker.

6. A method for operating a control module, comprising:

providing the control module, wherein the control module has:

a voltage input for a control voltage which if absent from a terminal for the circuit breaker is effective for triggering the interrupt function for the electric circuit breaker, an output carrying the control voltage to connect an interrupter switch for a circuit breaker, a control voltage input for the control voltage fed back from the interrupter; and a measuring unit coupled to the control voltage input and the output;

selectively switching the control voltage fed back from the interrupter by way of a control switch responsive to an actuating signal, wherein, when the control switch is an electrically closed switching condition, connecting the terminal for the circuit breaker to apply the control voltage to the circuit breaker, and further wherein, when the control switch is an electrically open switching condition, disabling the terminal for the circuit breaker from applying the control voltage to the circuit breaker;

in response to the control voltage, generating a current and/or a voltage at the control voltage input and the output;

measuring with the measuring unit the current and/or the voltage;

transmitting the measured current and/or voltage to an evaluating unit; and determining a characteristic value which correlates to a quality condition indicative of an impending failure of the interrupter switch, wherein the characteristic value is determined based upon the current and/or voltage received by the evaluating unit.

7. The method according to claim 6, wherein the evaluating unit determines an electrical current characteristic of the interrupter as the characteristic value.

8. The method according to claim 7, wherein the evaluating unit determines an ohmic resistance of the interrupter as the characteristic value.

9. The method according to claim 6, wherein the interrupter and/or a lead running from the input and/or the output thereto is repaired, if the characteristic value corresponding to a quality is of low value.

10. The method according to claim 8, wherein the interrupter and/or a lead running from the input and/or the output thereto is repaired, if the characteristic value corresponding to a quality is of low value.

11. The method according to claim 6, wherein given a characteristic value corresponding to a quality of low value, the circuit breaker is switched off in controlled manner.

12. The method according to claim 8, wherein given a characteristic value corresponding to a quality of low value, the circuit breaker is switched off in controlled manner.

13. The method according to claim 10, wherein given a characteristic value corresponding to a quality of low value, the circuit breaker is switched off in controlled manner.

14. The method according to claim 6, wherein the control module is connected to a plant control system, and wherein currents and/or voltages and/or the characteristic value are transmitted to the plant control system for further processing.

* * * * *